United States Patent
Campagna

(10) Patent No.: US 7,218,109 B2
(45) Date of Patent: May 15, 2007

(54) METHOD AND CONTROL DEVICE FOR OPERATING A MAGNETIC RESONANCE TOMOGRAPHY APPARATUS TO SELECT APPROPRIATE LOCAL COILS

(75) Inventor: Swen Campagna, Engelthal (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/145,321

(22) Filed: Jun. 3, 2005

(65) Prior Publication Data

US 2005/0275402 A1    Dec. 15, 2005

(30) Foreign Application Priority Data

Jun. 3, 2004    (DE)    ............... 10 2004 026 996

(51) Int. Cl.
*G01V 3/00* (2006.01)
(52) U.S. Cl. ..................... 324/309; 324/307
(58) Field of Classification Search ............. 324/309, 324/307
See application file for complete search history.

(56) References Cited

U.S. PATENT DOCUMENTS

| 6,724,923 | B2 * | 4/2004 | Ma et al. ............ 382/131 |
| 6,738,501 | B2 * | 5/2004 | Ma et al. ............ 382/131 |
| 6,794,872 | B2   | 9/2004 | Meyer et al. |
| 6,961,455 | B2 * | 11/2005 | Ma et al. ............ 382/131 |
| 6,990,223 | B2 * | 1/2006 | Ma et al. ............ 382/131 |

* cited by examiner

*Primary Examiner*—Louis M. Arana
(74) *Attorney, Agent, or Firm*—Schiff Hardin LLP

(57) ABSTRACT

In a method for generation of magnetic resonance exposures and a control device for a magnetic resonance tomography apparatus, a number of coils are available in the apparatus, the coils being are positioned at various locations relative to the examination subject. Initially a radio-frequency signal is emitted and a spatially-resolved signal intensity distribution is measured with at least one or some of the available coils. An automatic determination of a three-dimensional exposure profile of the appertaining coils is made based on the received signals. A selection of one or more of the appertaining coils for a subsequent magnetic resonance measurement is made on the basis of the determined exposure profiles of the coils as well as the measurement region to be acquired in the magnetic resonance measurement.

14 Claims, 8 Drawing Sheets

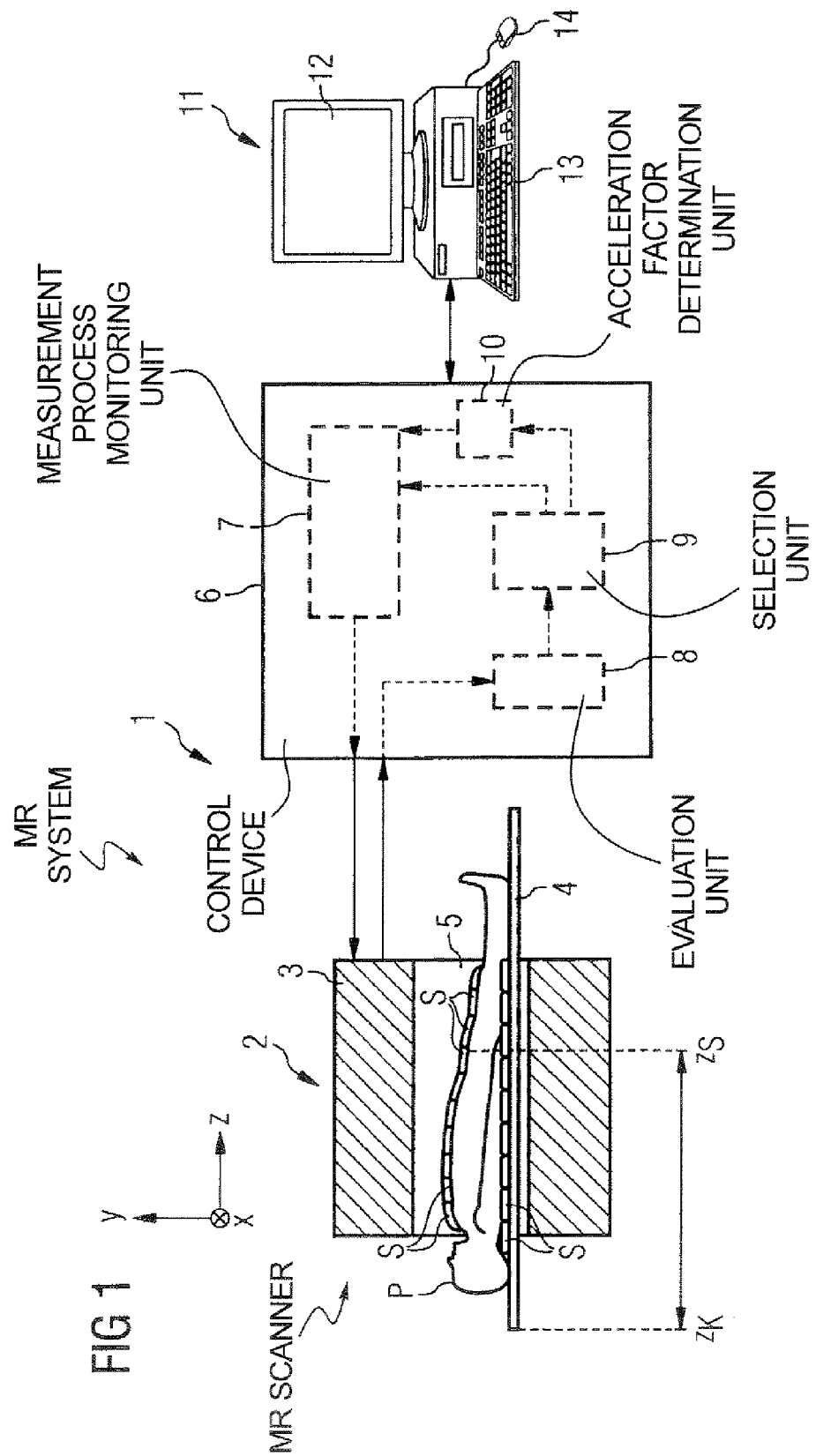

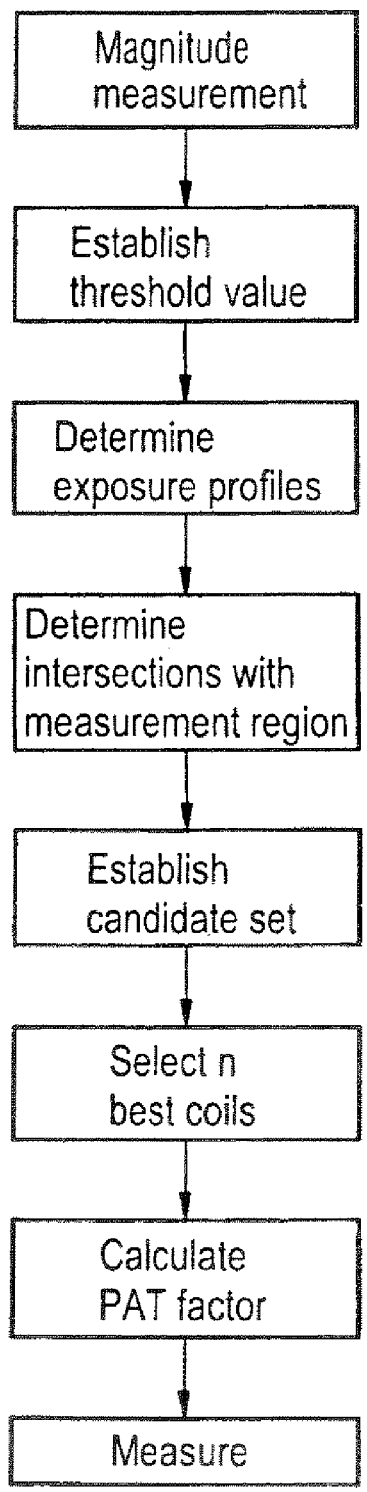

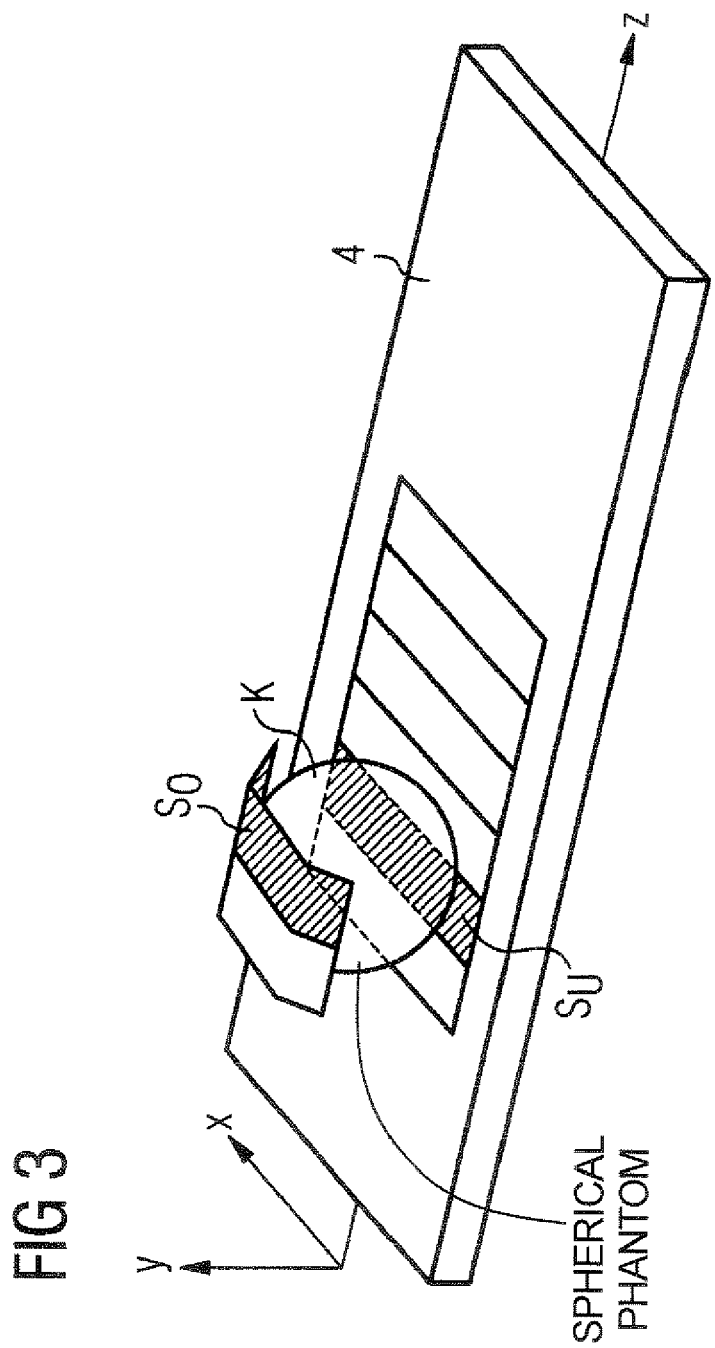

METHOD AND CONTROL DEVICE FOR OPERATING A MAGNETIC RESONANCE TOMOGRAPHY APPARATUS TO SELECT APPROPRIATE LOCAL COILS

BACKGROUND OF THE INVENTION

1. Field of the Invention

The present invention concerns a method for generation of magnetic resonance exposures of an examination subject, wherein a number of coils that are positioned at various locations relative to the examination subject are available in the magnetic resonance tomography apparatus that is used. Moreover, the invention concerns a corresponding control device for a magnetic resonance tomograph in order to generate magnetic resonance exposures of an examination subject according to such a method as well as a magnetic resonance tomography apparatus with such a control device.

2. Description of the Prior Art

Modern magnetic resonance (MR) systems normally operate with a number of various antennas (called coils in the following) for emission of radio-frequency pulses for nuclear magnetic resonance excitation and/or for receipt of the induced magnetic resonance signals. A magnetic resonance system normally has a larger whole-body coil that is permanently installed in the apparatus. The whole-body coil is typically cylindrical—for example having a structure known as a birdcage structure—around the patient acceptance chamber in which the patient is positioned on the patient positioning table during the measurement (data acquisition). Furthermore, one or more small local coils or, respectively, surface coils are frequently used in an MR tomography apparatus. In some examinations, a number of coil arrays each composed of one or more connected coils are often placed on and/or under the patient. These local coils serve to acquire more detailed images of body parts or organs of a patient that are located relatively close to the body surface. For this purpose, the local coils are applied directly at the location of the patient at which the region to be examined is located. Given the use of such a local coil, in many cases the magnetic resonance signals are excited using the whole-body coil (as a transmission coil) and are received with the local coil (as a reception coil).

For the generation of high-quality magnetic resonance exposures, it is without doubt important to select, from among the multiple of coils present in the apparatus, the coils that are particularly suitable for a specific measurement of a specific measurement region, i.e. for example a specific slice or a slice stack or volume within the measurement subject. This conventionally ensues manually by the input of appropriate selection commands at a control terminal of the tomography apparatus. The operator makes his or her selection depending on whether the appertaining coil is located in a suitable position relative to the region to be acquired in the subsequent measurement and exhibits a matching exposure region, i.e. whether the region of interest can actually be measured with this coil.

For coils with a fixed position with regard to the patient positioning table, this position is in part explicitly set at the manufacturer's facility. This position is then in principle known to the magnetic resonance system, i.e. in the control device of the magnetic resonance tomography apparatus, even though this coil normally can be shifted within a small range. As an alternative, the position can be explicitly measured before the magnetic resonance measurement. A method for determination of a coil position is, for example, specified in German OS 102 07 736. A magnetic field gradient is thereby applied in the appertaining spatial direction in which the position of the coil should be determined. A radio-frequency signal is then emitted with the whole-body coil or with a local coil, and a reception signal profile is measured in a direction along the magnetic field gradient by means of the appertaining local coil whose position is to be established. Finally, the position of the local coil is determined in the appertaining spatial direction with the aid of this signal profile. In addition to being received by the local coil to be localized, the reception signals are received by an antenna with a homogeneous sensitivity over the entire measurement space, for example by the whole-body coil. The intensity values received by the local coil are normalized with the intensity values received by the antenna with homogenous sensitivity. A function that is approximated to the shape of the sensitivity profile of the local coil is adapted to the spatial curve of these normalized intensity values. The maximum point of this function is then adopted as the position of the local coil.

Generally, only the position in the z-direction (i.e. in the longitudinal direction of the patient positioning table) is measured (detected). As before, the coordinates perpendicular to this are unknown and, with some manufacturers, are approximated at the factory to an average expected value. An exposure region can likewise be specified at the factory, but this is merely a estimated exposure region to be expected on average. In particular, it is not considered whether this region is also actually filled by a load in a measurement or whether, due to the load, the exposure region has a very different shape than the specified (for example rectangular) shape.

The correct selection of the coils thus requires a significant degree of knowledge and experience on the part of the operator, particularly since the available information specified at the factory about positions and exposure regions of the coils is often not sufficiently precise in practice and does not take into account the real factors for the actual measurement. Insofar as the optimal coil or coil combination is not selected for a subsequent measurement, the quality of the subsequent exposures is also unavoidably worsened. This can possibly lead to scans having to be repeated, which extends the total exposure time. This not only reduces the efficiency of the magnetic resonance tomography apparatus and of the operating personnel, but also most notably leads to a higher exposure of the patient.

SUMMARY OF THE INVENTION

An object of the present invention is to provide an optimized method for generation of magnetic resonance exposures in a magnetic resonance tomograph with a number of coils as well as a corresponding control device and a magnetic resonance tomography apparatus with which the generation of magnetic resonance exposures is possible in this manner.

This object is achieved in accordance with the invention by a method wherein a radio-frequency signal is initially emitted—for example with the whole-body coil—and a signal intensity is measured with spatial resolution using at least some or one of the available coils. Such a spatially-resolved signal intensity distribution of a coil is frequently designated as a "magnitude map" or "magnitude representation". It is a fast 3D measurement in which the individual coils respectively measure the magnetic resonance signal received in a specific volume element (typically called a "voxel" in magnetic resonance tomography). The sum of the sensitivity of the reception coil used as well as the underlying load situation are thereby always measured. Such a spatially-resolved measurement of the signal intensity is possible by the application of suitable gradient fields or gradient pulses. This is generally known to those skilled in the art and need not be explained further. The measurement of the magnitude representation is also designated in the following as magnitude measurement.

A three-dimensional exposure profile of the appertaining coil thus can automatically be determined on the basis of the measured signal intensity distributions, and if applicable an automatic determination of the respective position can also ensue insofar as this is not known with sufficient precision from other measurements. Finally, a selection of one or more of the appertaining coils for a subsequent magnetic resonance measurement inventively ensues based on the determined exposure profiles as well as on the basis of the measurement region to be acquired in the magnetic resonance measurement. The selection can also ensue based on the positions of the coils.

The "subsequent magnetic resonance measurement", as used herein is not necessarily the immediately following magnetic resonance measurement; but can be a later measurement to be implemented, for example after other measurements have occurred beforehand. In particular it is possible to initially measure the various signal intensity distributions for all coils present in the magnetic resonance tomography apparatus and to correspondingly evaluate these distributions, and then in a measurement protocol to establish beforehand which measurement is implemented with which coils. This measurement protocol is subsequently executed.

An advantage of the inventive method is that, within the measurement of the signal intensity distribution, it is exactly established what the individual coils actually "see." This means that a specific, theoretical viewing range of the coil is no longer assumed, which is different from the conventional approach. It is particularly advantageous that the load situation of the coil is also taken into account by the measurement, and therefore the subsequent selection of the coils ensues based on the actual existing situation.

An inventive control device for a magnetic resonance tomography apparatus that controls a number of coils available in the apparatus for generation of magnetic resonance exposures, which coils are positioned at various positions relative to the examination subject, also includes (in addition to the typical components which form such a control device) a measurement process monitoring device that ensures that a suitable radio-frequency signal is radiated and that a signal intensity distribution is respectively measured with spatial resolution by at least some or one of the available coils. Moreover, this control device has an evaluation device that automatically determines the respective three-dimensional exposure profiles and, if applicable, the positions of the appertaining coils based on the received signals. Finally, the control device has a selection device that selects one or more of the appertaining coils for a subsequent magnetic resonance measurement, on the basis of the exposure profiles of the coils, and possibly the determined positions, as well as on the basis of the measurement region to be exposed in the magnetic resonance measurement, which typically is predetermined by the operator beforehand via a terminal (console) or via an automatic measurement program.

Such a magnitude representation preferably is acquired for each individual coil located in the magnetic resonance tomography apparatus or the magnetic field thereof. In principle, however, it is possible for the magnitude measurement to be implemented only for some or one of the available coils. For example, for a magnetic resonance tomography acquisition in the region of the knee of a patient, it is not also necessary to implement a magnitude measurement for the local coils located at the head of the patient since, given this positioning, from the outset it can be assumed that these coils are not in a position to expose the desired region. Under the circumstances, it is therefore reasonable to initially select a group of coils that are theoretically considered for the measurement and then to record an individual signal intensity distribution only for these coils.

In principle the signal intensity distribution can be directly used as an exposure profile, i.e. a grayscale image, for example, is generated as an exposure profile in which each voxel is weighted with the signal intensity value.

To determine an exposure profile of a coil, however, preferably it is respectively checked whether the signal intensity measured at a specific voxel with the appertaining coil is above a specific threshold value. This means that the signal intensity distribution is converted into a binary bitmap in which, in each voxel, it is determined only whether the coil receives a sufficient intensity or not.

The threshold values can be arbitrarily selected. The threshold value preferably is determined on the basis of a predetermined proportion of a maximum measured signal intensity, i.e. the threshold value is, for example, at a specific percentage of the measurement maximal value. This maximum value, for example, can be the maximum value of the intensity distribution measured with the appertaining coil itself. Preferably, however, it is the magnitude measurement of received signal intensities, since a normalization across all coils used in the measurement is thus achieved.

Additionally or alternatively, an absolute minimum value, or a combination of a threshold that is a relative fraction of the maximal measured intensity value and an absolute minimum value can be selected. This has the advantage of ensuring that an adequate signal is measured with the coils selected for the magnitude measurement.

The selection of the coils preferably ensues on the basis of the various slice volumes of the measurement region with the exposure profiles determined for the appertaining coils.

This means that an intersection of the respective three-dimensional exposure profile with the region to be examined is determined, for example a specific slice, a slice stack, a specific volume, a region of interest (ROI) etc. Given known coil positions that can be established using the measured signal intensity distribution and with the aid of the binary exposure profile generated from the signal intensity distribution, the determination of such slice regions can be implemented fully automatically, quickly and simply.

Preferably a candidate quantity of coils that are under consideration for the subsequent measurement is determined using these section regions. Finally, the coils that are actually to be used later can be selected dependent on the boundary conditions of the actual application.

A maximum number n of coils preferably is predetermined since, in many applications, the number of the measurement inputs is limited or fixed, for example according to hardware only a maximum number of radio-frequency channels are actually available, or perhaps the operator would like to allow only a maximum upper limit in order to acquire data with optimally few measurement channels, thus reducing the measurement time. A corresponding number n of best coils for the subsequent measurement is then, selected from the previously-determined candidate set according to a predetermined selection criterion or according to a predetermined combination of selection criteria.

Which coils are the n "best" for a specific case depends on the selection criterion or the combination of selection criteria. For example, it may be determined that n coils should be selected whose exposure profiles exhibit the largest intersection area with the measurement region. A number of coils may be selected whose exposure profiles in fact at least partially include the measurement region, but in which the exposure profiles are optimally disjointed in order to thus maximize the total exposure region acquired by the coils, or to cover a specific region with optimally few coils. Instead of a specific number of coils the operator may predetermine that he or she would like to use only a minimum number of coils. The coil combination is then directly selected with which the desired measurement region is covered with the fewest coils.

In a preferred exemplary embodiment of the inventive method, for a subsequent magnetic resonance measurement an acceleration factor for a parallel image acquisition, known as a PAT factor (PAT=parallel acquisition technique), is automatically determined on the basis of the determined positions and/or the exposure profiles of the coils as well as of the measurement region to be acquired in the magnetic resonance measurement.

A significant acceleration of the pure measurement time of pulse sequences for magnetic resonance examination can be achieved using parallel acquisition techniques. In these known techniques, due to different sensitivity profiles, certain spatial information can already be associated with the signals acquired by the respective coils. It is thereby important that the sensitivity profiles of the coils differ in the direction of the desired acceleration. The acceleration factor of a magnetic resonance measurement for parallel acquisition techniques is freely selectable and is normally a parameter that can be set by the operator, dependent on the coils used and their sensitivity profiles. The specification of a reasonable (sensible) value for such an acceleration factor is extremely complex and requires a great deal of experience and a precise knowledge about the immediately existing measurement situation. In practice, apparatuses exist that suggest a PAT factor to the operator, but the calculation for this is based on the relatively vague information that are provided by the manufacturer for the individual coils and their positions. This means the current situation, in particular the load, is also not considered in these calculations. These suggestions therefore often are not satisfactory.

Since, with the inventive method, the actual given exposure profiles are available to the system with the load situation being taken into consideration, the precise position of the individual coils in the magnetic resonance tomography apparatus, etc., a significantly more precise automatic calculation of reasonable PAT factors that are available for the subsequent measurement is possible on the basis of this data. Methods for calculation of PAT factors are known to those skilled in the art and therefore do not need to be explained in detail herein.

The inventive control device preferably additionally has an acceleration factor determination unit for this purpose, in order to automatically determine an acceleration factor for the subsequent magnetic resonance measurement on the basis of the determined positions and/or exposure profiles of the coils as well as the measurement region to be acquired in the magnetic resonance measurement.

Since, due to the magnitude measurements, an exact, patient-specific or load-specific database is available for each of the coils, as already mentioned it can be established for each coil how much signal it actually sees at which location. A wholly-automatic calculation of the acceleration factor and a corresponding application of this acceleration factor in a subsequent measurement thus are possible without anything further, in contrast to known methods wherein how much a specific coil would theoretically "to see" on average is always assumed from a database. Nevertheless, the option is preferably given to the operator to intervene in the measurement. This is supported by information about the selected coils and/or the acceleration factor being provided as an output to the operator, for example via an operator console, before the magnetic resonance measurement. The operator can then approve the selection or manually change the coil selection and/or the acceleration factor insofar as the operator feels this to be necessary.

DESCRIPTION OF THE DRAWINGS

FIG. 1 schematically illustrates a magnetic resonance system constructed and operating in accordance with the present invention.

FIG. 2 is a flowchart of a preferred embodiment of the inventive method.

FIG. 3 is a perspective, schematic representation of a spherical phantom with a local coil array disposed beneath it as well as a local coil array disposed above it, as used in accordance with the invention.

DESCRIPTION OF THE PREFERRED EMBODIMENTS

Figure 4A:
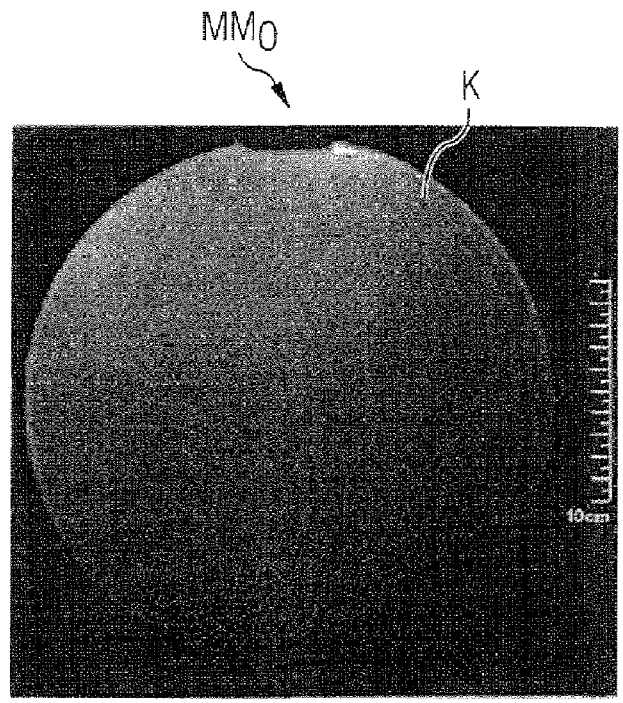
FIG. 4A shows a signal intensity distribution acquired with one of the upper coils for the spherical phantom according to FIG. 3.

FIG. 1 shows an exemplary embodiment for a magnetic resonance system 1 that is operable according to the inventive method. The core of this magnetic resonance system 1 is the magnetic resonance scanner 2, in which a patient P is positioned on a patient positioning table 4 (also called a recumbent board 4) in an annular basic field magnet 3 that surrounds the measurement volume 5. A number of local coils S are located on and possibly also under the patient.

The table 4 can be moved in the longitudinal direction, i.e. along the longitudinal axis of the scanner 2. This direction is designated as the z-direction in the indicated spatial coordinate system (likewise shown). A whole-body coil (not shown in detail) with which radio-frequency pulses can be emitted and received is located within the basic field magnet in the scanner 2. Moreover, in a typical manner (not shown in Figure), the scanner 2 has gradient coils in order to be able to apply a magnetic field gradient in each of the spatial directions x, y, z.

The scanner 2 is activated by a control device 6, which here is shown separately. A terminal 11 is connected to the control device 6. This terminal 11 has a screen 12, a keyboard 13 and a pointer device for a graphical user interface, for example a mouse 14 or the like. Among other things, the terminal 11 serves as a user interface via which an operator operates the control device 6 and therewith the scanner 2. Both the control device 6 and the terminal 11 also can be integral components of the scanner 2.

The magnetic resonance system 1 can also include all further typical components or features of such systems such as, for example, interfaces for connection of a communication network, for example an image information system or the like. These components are not shown in FIG. 1 for clarity.

An operator can communicate with the control device 6 via the terminal 11 and thus provide for the implementation of the desired measurements. For example, the scanner 2 can be activated by the control device 6 such that the necessary radio-frequency pulse sequences are emitted by the radio-frequency coils and the gradient coils are switched in a suitable manner. The raw image data coming from the scanner 2 are also acquired via the control device 6 and the images are reconstructed in a signal reconstruction unit (not shown), which can be, for example, a module of the control device 6. These images can then be shown on the monitor 12 of the terminal 11 and/or stored in a memory or transmitted over a network.

For execution of the inventive method, the control device 6 has a measurement process monitoring unit 7 that ensures that the magnitude representations for the desired coils S are measured. For this purpose, the measurement process monitoring unit 7 activates, for example, the whole-body coil in the scanner 2 such that a radio-frequency signal at the necessary resonant frequency is emitted and the gradients are switched to match, and such that the received magnetic resonance signals are then read out via the individual local coils S.

The raw measurement data acquired in this manner arrive at an evaluation unit 8 in the control device 6. The evaluation unit 8 automatically determines the respective positions $z_S$ and the three-dimensional exposure profiles of the appertaining coils S on the basis of the received signals. The respective positions Zs preferably are determined relative to a fixed point $Z_K$ on the table 4, for example relative to the head end of the table 4 in FIG. 1.

After this evaluation, both the exact positions within the scanner 2 and the respective actual given exposure profiles are known for all measured coils S. These data are then transferred to a selection unit 9 that selects one or more of the coils S for the subsequent magnetic resonance measurement based on the determined positions and exposure profiles of the coils S, as well as on the basis of the measurement region to be acquired in the subsequent measurement. The selection unit 9 receives the necessary information about the measurement region to be acquired, for example from the operator via the terminal 11 or from a measurement protocol that predetermines the precise steps of a subsequent measurement.

The information about the selected coils is then transferred to the measurement process monitoring unit 7 which, for example, may also be responsible for the implementation of the actual desired imaging magnetic resonance measurement.

Here the control device 6 additionally has an acceleration factor determination unit 10 that likewise receives the data about the selected coils S from the selection device 9. This acceleration factor determination unit 10 determines the most suitable acceleration factor based on the determined positions and exposure profiles of the coils S as well as the position of the measurement region to be acquired and transfers the acceleration factor to the measurement process monitoring unit 7.

The components necessary for realization of the invention in a magnetic resonance system 1, such as the activation unit 11, the measurement process monitoring unit 7, the evaluation unit 8, the selection unit 9 and (if present) the acceleration factor determination unit 10, can be created completely or in a predominant part in the form of software components. Typical magnetic resonance systems embody programmable control devices anyway, such that the invention preferably can be realized in this manner by means of suitable control software. This means that a corresponding computer program product that contains program code means in order to implement the inventive method is loaded directly into the storage of a programmable control device 6 of the appertaining magnetic resonance system 1. Existing magnetic resonance systems can also be simply and cost-effectively retrofitted in this manner.

Some of the components can be realized as sub-routines in components that are already present in the control device 6, or existing components can be used for the inventive purpose as well. This is particularly suitable for the measurement process monitoring unit 7, which can be a measurement process monitoring device that is already present in an existing control device 6, and which is designed to activate the radio-frequency coils, gradient coils or other components in tomographs in a suitable manner to implement a typical imaging measurement. For this purpose, a modification of the existing measurement process monitoring device could ensue via a suitable software sub-route. The evaluation unit 8 can likewise also be designed as a sub-module of a general purpose image evaluation unit.

A flowchart of an exemplary embodiment of an inventive measurement is shown in FIG. 2. Reference is also made to FIGS. 3 and 4A through 8B, which a test measurement using a spherical phantom is explained.

The test measurement shown in FIG. 3 as an example makes use of a spherical phantom K positioned on the table 4. The spherical phantom K is a glass sphere filled with distilled water. A coil array with two local coils, of which one local coil $S_O$ is used for the following measurements, is arranged on top of the spherical phantom K. A spinal coil array, of which likewise only one local coil $S_U$ is used for the subsequently described measurements, is positioned below the spherical phantom K.

Figure 4B:
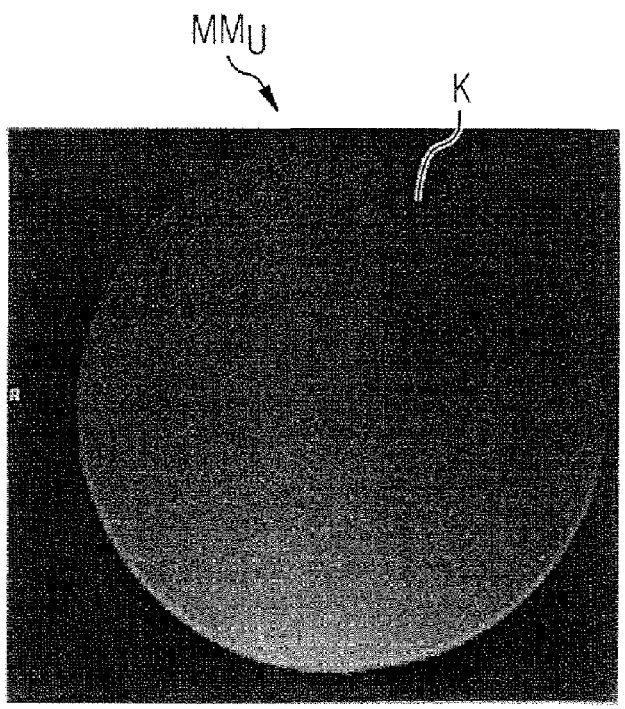
FIG. 4B shows a signal intensity distribution acquired with one of the lower coils for the spherical phantom according to FIG. 3.

In a first method step according to FIG. 2, the magnitude measurements have been implemented. FIGS. 4A and 4B show the results of these measurements for the coils $S_O$, $S_U$ defined above on the spherical phantom K. FIG. 4A shows the measurement for the upper coil $S_O$ and FIG. 4B shows the measurement for the lower coil $S_U$. The air bubble which is located at the top in the spherical phantom K is clearly seen in FIG. 4A.

The originally-measured magnitude representations $MM_O$, $MM_U$ are respectively shown FIGS. 4A and 4B, wherein the intensity per voxel is shown in the form of grayscale values. In principle, an automatic coils selection could now already be implemented with these grayscale values, for example by the gray value or the associated signal intensity being considered as a weighting for this voxel. The representations in FIGS. 4A and 4B thus can already be understood as exposure profiles.

However, in the variants of the inventive method explained in the following, a binary image is generated as an exposure profile, the binary image specifically only whether the respective coil $S_O$, $S_U$ in a specific voxel receives a sufficient intensity or not.

Figure 5A:
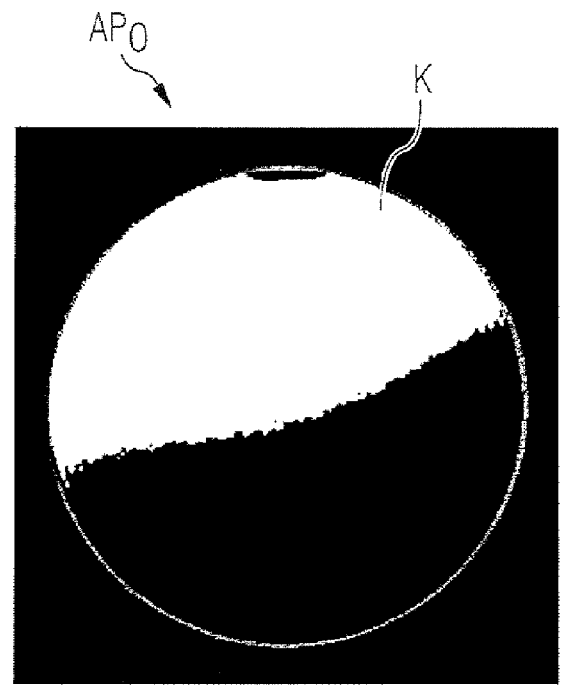
FIG. 5A shows a binary exposure profile of the upper coil for the spherical phantom according to FIG. 3.
Figure 5B:
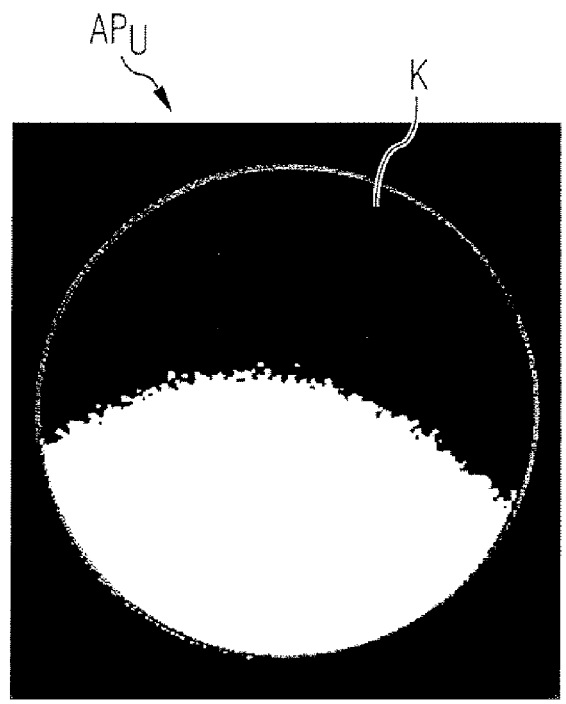
FIG. 5B shows a binary exposure profile of the lower coil for the spherical phantom according to FIG. 3.

For this purpose, in the second step according to FIG. 2 a threshold value is established. For example, a threshold value of 50% of the maximum intensity value that was received in the magnitude measurement is used. The signal received in the individual voxels, as results from FIGS. 4A, 4B, is subsequently compared with the threshold value. If the intensity value of a voxel is above the threshold value, this voxel is identified as belonging to the exposure region of the coil $S_O$, $S_U$. The exposure profiles $AP_O$, $AP_U$ of the upper coil $S_O$ and of the lower coil $S_U$ shown in FIGS. 5A and 5B are obtained from the magnitude representations $MM_O$, $MM_U$ shown in FIGS. 4A, 4B. A comparison of FIG. 4A with FIG. 5A shows the advantage of this formation of a binary exposure profile $AP_O$. In FIG. 5A it is clearly recognizable that the exposure profile of the upper coil $S_O$ is not right/left-symmetrical. This is harder to detect in FIG. 4A.

An intersection with the measurement region is then determined in a next step according to FIG. 2. It is thereby established which of the coils $S_O$, $S_U$ could actually be used for the measurement since its exposure profile $AP_O$, $AP_U$ exhibits a certain overlapping with the desired measurement region. In principle, other coils no longer need to be considered in the further selection since these are not able "to see" something within the desired region anyway.

Figure 6A:
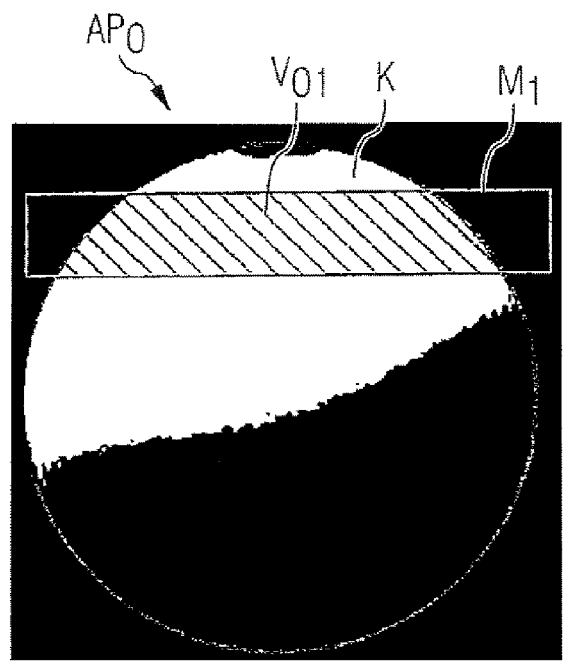
FIG. 6A is a representation of the exposure profile according to FIG. 5A with a measurement region plotted therein, situated in the upper region of the spherical phantom.
Figure 6B:
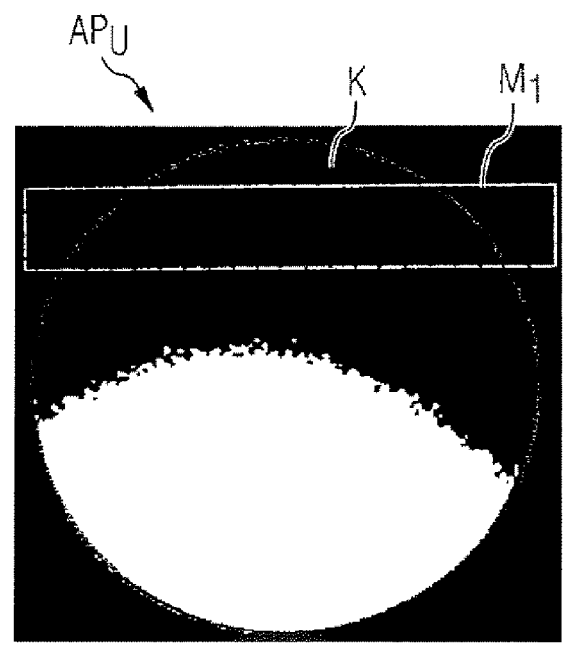
FIG. 6B is a representation of the exposure profile according to FIG. 5B with a measurement region plotted therein, situated in the upper region of the spherical phantom.
Figure 7A:
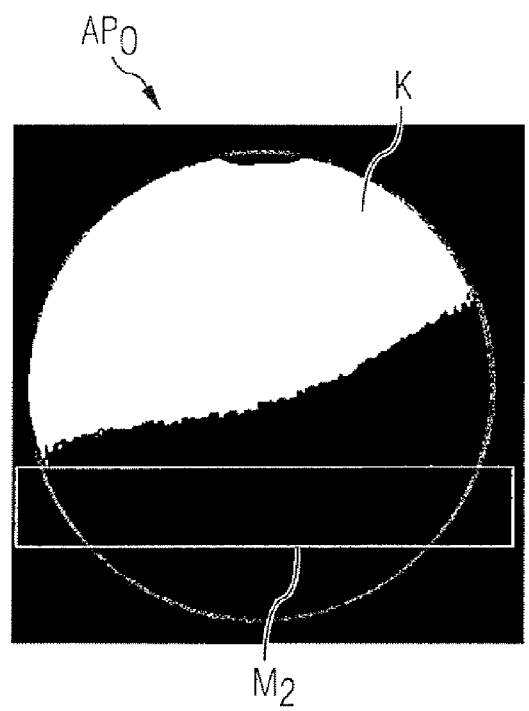
FIG. 7A is a representation of the exposure profile according to FIG. 5A with a measurement region plotted therein, situated in the lower region of the spherical phantom.
Figure 7B:
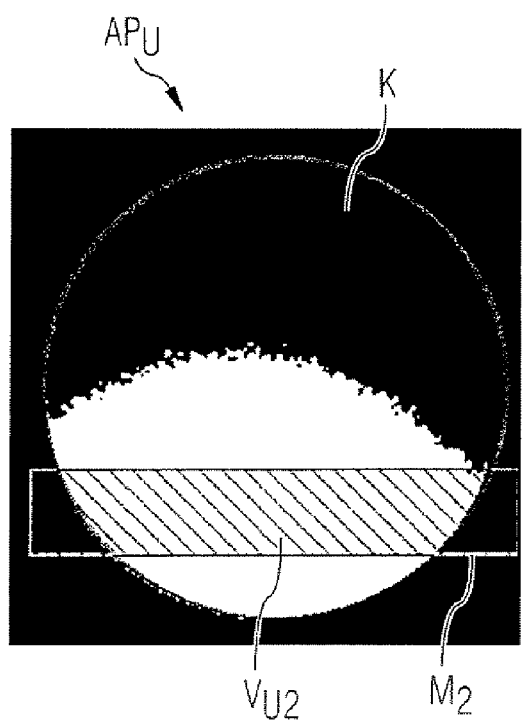
FIG. 7B is a representation of the exposure profile according to FIG. 5B with a measurement region plotted therein, situated in the lower region of the spherical phantom.
Figure 8A:
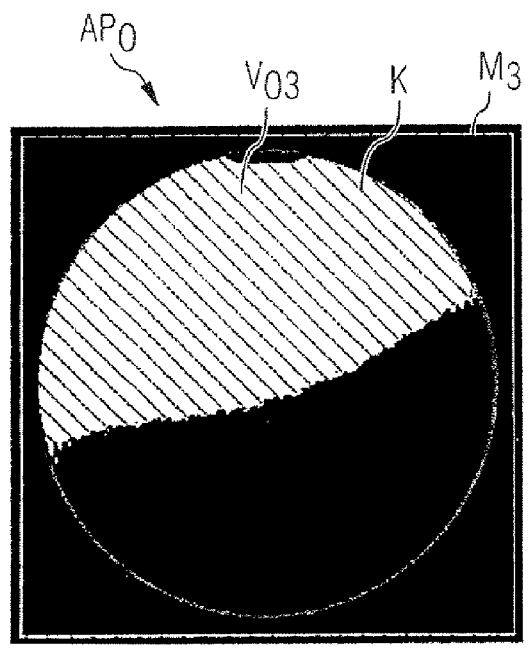
FIG. 8A is a representation of the exposure profile according to FIG. 5A with a third measurement region that covers the entire spherical phantom.
Figure 8B:
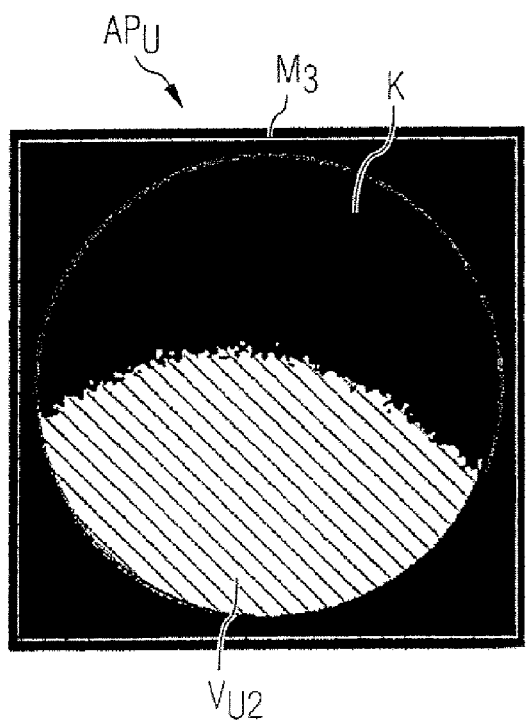
FIG. 8B is a representation of the exposure profile according to FIG. 5B with a third measurement region that covers the entire spherical phantom.

This is explained at the simple examples shown in FIGS. 6A through 8B, whereby FIGS. 6A, 7A, 8A respectively again show the exposure profile $AP_O$ of the upper coil $S_O$ and FIGS. 6B, 7B, 8B respectively show the exposure profile $AP_U$ of the upper coil $S_U$.

A first measurement region $M_1$ that lies in the upper region of the spherical phantom K is respectively plotted in FIGS. 6A and 6B. Here only the exposure profile $AP_O$ of the upper coil $S_O$ exhibits an intersection $V_{O1}$ with the measurement region $M_1$. By contrast, the exposure profile $AP_U$ of the lower coil $S_U$ does not overlap with the measurement region $M_1$. Therefore only the upper coil $S_O$ would be considered for the measurement of this measurement region $M_1$.

FIGS. 7A and 7B show a similar case, but here one of the two coils $S_O$, $S_U$ is to be selected for acquisition of a second measurement region $M_2$ in the lower region of the spherical phantom K. Here only the exposure profile $AP_U$ of the lower coil $S_U$ exhibits an intersection region $V_{U2}$ with the measurement region $M_2$, such that only the lower coil $S_U$ is considered for the measurement of this measurement region $M_2$.

A measurement region is selected in FIG. 8A that covers the entire spherical phantom K. The intersection region $V_{O3}$ of the exposure profile $AP_O$ of the upper coil $S_O$ consequently corresponds to the entire exposure profile $AP_O$. The same is true for the intersection region $V_{U3}$ of the exposure profile $AP_U$ of the lower coil $S_U$. In principle, both coils $S_O$, $S_U$ thus belong to the candidate set.

The best coils are then selected in the next step according to FIG. 2. This is trivial in the example shown in FIGS. 8A and 8B. In order to be able to measure the spherical phantom K overall, here both coils must be used for the measurement since the exposure profiles $AP_O$, $AP_U$ or the intersection regions $V_{O3}$, $V_{U3}$ are largely disjointed with the measurement region $M_3$ and thus only the entire measurement region $M_3$ can be covered.

It is clear that the aforementioned examples are extremely trivial cases in which a manual selection would also be unproblematic, but they are particularly descriptive for explanation of the invention. In the case of data acquisition from an extensive examination subject, for example the entire abdomen/chest area of a patient with a number of different local coils positioned on and/or under the patient, not only the number of the available local coils but (normally) also the quantity of the coils belonging to the candidate set that "see" something in the appertaining measurement region is significantly larger, such that in reality quite often the question arises to which of the coils that are able to cover a region of the measurement region should be selected in a suitable manner for the measurement.

The selection of the best coils can, as previously described, ensue based on the most varied criteria. One possibility is to use an optimally low number of coils that are able to cover the entire area that should be measured. Another alternative is to predetermine a fixed set of coils, for example eight coils, which are then associated with the eight measurement inputs available at typical control devices. The coils are then selected that, for example, exhibit the largest intersection region with the measurement region. In principle, in this decision procedure the original signal intensity profile (i.e. the magnitude representation) also can be used again, and in cases of doubt, for example, it can be decided which coil exhibits the greatest intensity in a specific part of the measurement region, i.e. which coil receives the best signal in a specific region.

After the coils have been selected, the acceleration factor (PAT factor) can then be calculated for the selected coils and the desired measurement can ensue with the selected coils and the calculated acceleration factor.

The magnitude measurements necessary for the implementation of the invention can be implemented relatively quickly. On average, such a measurement does not last longer than approximately 5 seconds, whereby a number of coils can be measured simultaneously. Furthermore, for the measurement of the magnitude representation it is not absolutely necessary to implement a totally independent, separate acquisition. For example, it is possible to combine a magnitude measurement with pre-scans for other application purposes, such as the acquisition of a sensitivity map or the like or to use these measurements as a magnitude representation, possibly after corresponding adaptations. In such cases, the inventive implementation of the measurement requires no additional measurement time.

It is should be noted again that the method workflow described in detail above as well as the shown magnetic resonance system are only exemplary embodiments which can be modified in the most varied manner by those skilled in the art without departing from the scope of the invention. Although the invention was described in the example of magnetic resonance systems in the medical field, the possibilities for usage of the invention are not limited to this field; rather, the invention can also be used in scientific and/or industrial systems.

I claim as my invention:

1. A method for operating a magnetic resonance apparatus to generate a magnetic resonance image of an examination subject, said magnetic resonance apparatus comprising a plurality of radio frequency coils available for use in acquiring magnetic resonance data from the examination subject, said plurality of coils being located at respective locations in the magnetic resonance apparatus relative to the examination subject, said method comprising the steps of:

emitting a radio frequency signal and acquiring spatially-resolved data, representing a signal intensity distribution, using at least some of said available coils;

in a computer, automatically determining a three-dimensional exposure profile as a time-resolved signal intensity distribution for each of said some of said coils based on the spatially-resolved data acquired therefrom; and dependent on said exposure profiles and dependent on a measurement region of the examination subject from which magnetic resonance imaging data are to be acquired, selecting at least one of said some of said coils for acquiring said magnetic resonance image data from said measurement region.

2. A method as claimed in claim 1 comprising automatically determining the respective positions of said some of said coils based on said spatially-resolved data received therefrom, and making said selection of said at least one of said some of said coils also dependent said respective positions.

3. A method as claimed in claim 1 wherein the respective signal intensity distributions for said some of said coils represents signal intensities for a plurality of voxels, and wherein the step of automatically determining respective three-dimensional exposure profiles comprises, in each signal intensity distribution, determining whether a signal intensity for each voxel exceeds a threshold.

4. A method as claimed in claim 3 comprising determining said threshold as a predetermined percentage of a maximum signal intensity of the respective signal intensity distribution.

5. A method as claimed in claim 1 comprising automatically determining respective intersection volumes of said exposure profiles with said measurement region, and making said selection of at least one of said some of said coils dependent on said intersection volumes.

6. A method as claimed in claim 5 comprising determining a candidate set of multiple coils in said some of said coils, for use in acquiring said magnetic resonance image data from said examination subject, dependent on said intersection regions.

7. A method as claimed in claim 6 comprising, from said candidate set, selecting a plurality of best coils for acquiring said magnetic resonance image data from said examination subject.

8. A method as claimed in claim 1 comprising automatically determining respective positions of said sum of said coils from said spatially-resolved data received therefrom, and automatically determining an acceleration factor for acquiring said magnetic resonance image data using a parallel acquisition technique, dependent at least one of the respective positions of said some of said coils, the respective exposure profiles of said some of said coils, and said measurement region of said examination subject.

9. A method as claimed in claim 8 comprising generating a humanly-perceptible output representing said acceleration factor at an operator interface, and allowing an operator to approve or alter said acceleration factor before acquiring said magnetic resonance image data from said examination subject.

10. A method as claimed in claim 1 comprising generating a humanly-perceptible output representing said at least one of said some of said coils that has been selected, at an operator interface, and allowing an operator to approve or alter said selection before acquiring said magnetic resonance image data from said examination subject.

11. A control device for a magnetic resonance tomography apparatus for obtaining a magnetic resonance image of an examination subject, said magnetic resonance tomography apparatus comprising a plurality of coils positioned at respective locations in said magnetic resonance tomography apparatus relative to the examination subject, said control device comprising:

a measurement process monitoring unit for emitting radio frequency signal and acquiring spatially-resolved data, representing a signal intensity distribution, using at least some of said available coils;

an evaluation unit for automatically determining a three-dimensional exposure as a time-resolved signal intensity distribution profile for each of said some of said coils based on the spatially-resolved data acquired therefrom; and a selection unit for, dependent on said exposure profiles and dependent on a measurement region of the examination subject from which magnetic resonance imaging data are to be acquired, selecting at least one of said some of said coils for acquiring said magnetic resonance image data from said measurement region.

12. A control device as claimed in claim 11 wherein said evaluation unit also determines the respective positions of said some of said coils from the spatially-resolved data received therefrom, and comprising an acceleration factor determination unit for automatically determining, for acquiring said magnetic resonance image data using a parallel acquisition technique, an acceleration factor from at least one of the respective exposure profiles and the respective positions of said some of said coils.

13. A magnetic resonance tomography apparatus comprising:

an opening adapted to receive an examination subject therein;

a plurality of coils disposed at respective positions relative to said opening available for emitting and receiving radio frequency signals; and a control device comprising a measurement process monitoring unit for emitting radio frequency signals and acquiring spatially-resolved data, representing a signal intensity distribution, using at least some of said available coils, an evaluation unit for automatically determining a three-dimensional exposure profile as a time-resolved signal intensity distribution for each of said some of said coils based on the spatially-resolved data acquired therefrom, and a selection unit for, dependent on said exposure profiles and dependent on a measurement region of the examination subject from which magnetic resonance imaging data are to be acquired, selecting at least one of said some of said coils for acquiring said magnetic resonance image data from said measurement region.

14. A computer-readable medium encoded with a data structure, and loadable into a control device of a magnetic resonance tomography apparatus having a plurality of available coils respectively disposed at different positions relative to an examination subject in the magnetic resonance tomography apparatus, said data structure programming said control device:

to operate some coils, from among plurality of said available coils, to emit a radio frequency signal and to acquire spatially-resolved data, representing a signal intensity distribution;

to automatically determine a three-dimensional exposure profile as a time-resolved signal intensity distribution for each of said some of said coils based on the spatially-resolved data acquired therefrom; and dependent on said exposure profiles and dependent on a measurement region of the examination subject from which magnetic resonance imaging data are to be acquired, at least one of said some of said coils for subsequently acquiring diagnostic magnetic resonance image data from said measurement region of said examination subject.

* * * * *